United States Patent
Kim

(10) Patent No.: US 8,599,110 B2
(45) Date of Patent: Dec. 3, 2013

(54) ORGANIC ELECTROLUMINESCENT DISPLAY AND A DRIVER THEREOF

(75) Inventor: Mihae Kim, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1405 days.

(21) Appl. No.: 11/987,203

(22) Filed: Nov. 28, 2007

(65) Prior Publication Data

US 2008/0143706 A1 Jun. 19, 2008

(30) Foreign Application Priority Data

Jan. 3, 2007 (KR) .................. 10-2007-0000617

(51) Int. Cl.
  *G09G 3/30* (2006.01)
(52) U.S. Cl.
  USPC .......................................................... 345/76
(58) Field of Classification Search
  USPC ............. 345/76–86, 204–215, 100, 690–699;
  377/64–83; 315/169.1–169.4
  See application file for complete search history.

(56) References Cited

U.S. PATENT DOCUMENTS

| | | | | |
|---|---|---|---|---|
| 5,128,974 | A | * | 7/1992 | Maekawa ......................... 377/81 |
| 7,545,352 | B2 | * | 6/2009 | Kwak et al. ...................... 345/82 |
| 2005/0116656 | A1 | * | 6/2005 | Shin ............................ 315/169.3 |
| 2005/0259095 | A1 | * | 11/2005 | Kwak ............................ 345/204 |
| 2005/0285827 | A1 | * | 12/2005 | Eom ............................... 345/76 |
| 2006/0087478 | A1 | * | 4/2006 | Eom ............................... 345/45 |
| 2006/0145964 | A1 | * | 7/2006 | Park et al. ....................... 345/76 |

FOREIGN PATENT DOCUMENTS

KR 10-2006-0036204 A 4/2006

* cited by examiner

*Primary Examiner* — Alexander Eisen
*Assistant Examiner* — Patrick F Marinelli
(74) *Attorney, Agent, or Firm* — Lee & Morse, P.C.

(57) ABSTRACT

A driver for a display may include a first signal processor adapted to output first and third control signals, and a second signal processor adapted to output a second control signal. The first signal processor may include a first shift register adapted to receive clock signals, and a first input signal, and to output a shifted signal. A first logic gate may be adapted to receive the shifted control signal and a separation signal to output the first control signal. A second logic gate may be adapted to receive the shifted signal and a negative separation signal, and to output the third control signal. The second signal processor may include a second shift register adapted to receive clock signals and the second input signal, and to output a shifted signal, and a first inverter adapted to receive the shifted signal of the second shift register and to output a second control signal.

23 Claims, 5 Drawing Sheets

ORGANIC ELECTROLUMINESCENT DISPLAY AND A DRIVER THEREOF

BACKGROUND OF THE INVENTION

1. Field of the Invention

Embodiments relate to a driver suitable for an organic electroluminescent display. More particularly, embodiments relate to a driver having two shift registers, but outputting three control signals, and associated methods.

2. Description of the Related Art

Various kinds of light and small-sized light emitting displays have been developed to supersede cathode ray tubes. Organic electroluminescent displays may have excellent light emitting efficiency, high luminance, excellent view angle, and a high response speed, and have thus been of great interest. Organic electroluminescent displays have been used as displays of portable information terminals, e.g., personal computers, handsets, personal digital assistants (PDAs), various kinds of information machines, etc.

An organic electroluminescent display may emit light by electrically exciting fluorescent or phosphorescent materials. The organic electroluminescent display may drive N×M organic electroluminescent display elements so as to display an image.

As illustrated in FIG. 1, the organic electroluminescent display element may include an anode of, e.g., indium tin oxide (ITO), an organic thin film and a cathode of, e.g., metal. The organic thin film may have a multi-layered structure including an emitting layer EML adapted to emit light by combining electrons and holes, an electron transport layer ETL adapted to transport electrons, and a hole transport layer HTL adapted to transport the holes. The organic thin film may include an electron injecting layer EIL adapted to inject the electrons and a hole injecting layer HIL adapted to inject the holes.

Techniques for driving the organic electroluminescent device may include a passive matrix (PM) technique and an active matrix (AM) technique employing a thin film transistor (TFT) or a metal oxide semiconductor field effect transistor (MOSFET). The PM technique may drive a light emitting cell by forming an anode intersecting a cathode and selecting a line. The AM technique is a driving technique that may connect the TFT and the capacitor to respective ITO pixel electrodes to maintain a voltage by employing charge stored by a capacitor. The AM technique may be a voltage programming technique or a current programming technique according whether a signal applied from a data driver is a current or a voltage.

A related art organic electroluminescent display may include pixels of each color in order to display various colors. A respective color may be represented by a combination of colors that emit light from the pixels. Each pixel may include a pixel circuit for displaying a red (R), a green (G) and a blue (B) color. A respective color may be produced by a combination of the R, G and B colors.

FIG. 2 illustrates a diagram of N×M pixel circuits of a related art voltage programming technique for driving an organic electroluminescent element.

Referring to FIG. 2, a driving transistor M1 may be connected to second, third and fourth switching elements S2, S3 and S4. The respective switching elements S2, S3 and S4 may receive a red light emitting control signal EmR[n], a green light emitting control signal EmG[n] and a blue light emitting control signal EmB[n] so as to supply a driving current to a red organic electroluminescent element OLEDR, a green organic electroluminescent element OLEDG, and a blue organic electroluminescent element OLEDB, respectively. An amount of current flowing through the driving transistor M1 may be controlled by a data voltage that is applied through a first switching element S1. A capacitor C1 may be connected between a gate and a source of the driving transistor M1 so as to maintain the applied voltage constant. The first switching element S1 may include a source connected to a data line Data[m] and a gate connected to a scan line Scan[n]. The circuit may include first and second power voltages VSS and VDD.

When the first switching element S1 is turned on in response to a scanning signal that is applied to the gate of the first switching element S1, a data voltage from the data line Data[m] may be applied to the gate of the driving transistor M1. Then, a driving current that corresponds to a voltage charged between the gate and the source of the driving transistor M1 may flow into the drain of the driving transistor M1. The red organic electroluminescent element OLEDR may emit red light via the driving current, when the second switching element S2 is turned on by the red light emitting control signal EmR[n]. The green organic electroluminescent element OLEDG may emit green light via the driving current, when the third switching element S3 is turned on by the green light emitting control signal EmG[n]. The blue organic electroluminescent element OLEDG may emit blue light via the driving current, when the fourth switching element S4 is turned on by the blue light emitting control signal EmB[n].

In order to drive the pixels, the respective pixel circuit may require a circuit for driving the organic electroluminescent element, a data driver for transferring a data signal, a scan driver for transferring a scan signal, and a light emitting control driver for transferring a light emitting control signal.

The light emitting control driver may include R, G and B light emitting control drivers for supplying each of the R, G and B light control signals, respectively. Since the R, G and B light emitting control drivers may each include a shift register, there may be a problematic increase in a size of the circuit due to many components.

The above information disclosed in this Background section is only for enhancement of understanding of the background of the invention, and therefore it may contain information that does not form the prior art that is already known in this country to a person of ordinary skill in the art.

SUMMARY OF THE INVENTION

Embodiments are therefore directed to a driver suitable for an organic electroluminescent, which substantially overcome one or more of the problems due to the limitations and disadvantages of the related art.

It is therefore a feature of an embodiment to provide a driver suitable for an electroluminescent display which may reduce circuit area.

It is therefore another feature of an embodiment of to provide driver suitable for an organic electroluminescent display which may improve yield by decreasing an error rate caused by the transistors, by generating three light emitting control signals, i.e., a R light emitting control signal, a G light emitting control signal and a B light emitting control signal using only two signal processors.

At least one of the above and other features and advantages of embodiments may be realized by providing a driver for a display including a first signal processor adapted to output first and third light emitting control signals, and a second signal processor adapted to output a second light emitting control signal.

The first signal processor may be adapted to receive a clock signal, a negative clock signal, a first input signal, a separation signal, and a negative separation signal, and the second signal processor may be adapted to receive the clock signal, the negative clock signal and a second input signal.

The first signal processor may include a first shift register adapted to receive a clock signal, a negative clock signal, and a first input signal, and to output a shifted signal, a first logic gate adapted to receive the output control signal from the first shift register and a separation signal, and to output the first light emitting control signal, and a second logic gate adapted to receive the output control signal from the first shift register and a negative separation signal, and to output the third light emitting control signal.

The separation signal and negative separation signal may be adapted to separate the shifted signal of the first shift register into the first and third light emitting control signals. The shifted signal of the first shift register may be an input signal of a first shift register of a next row. The logic gates may be NAND gates.

The second signal processor may include a second shift register adapted to receive the clock signal, the negative clock signal and a second input signal, and to output a shifted output signal, and a first inverter adapted to receive the shifted signal of the second shift register and to output a second light emitting control signal. The shifted signal of the second shift register may be an input signal of a second shift register of a next row.

Each of the first and second shift registers may include a first PMOS switching element adapted to output a first power voltage in accordance with the negative clock signal, a second PMOS switching element adapted to output the first power voltage to a first node in accordance with a shift register input signal, a first NMOS switching element adapted to output a second power voltage in accordance with the clock signal, a second NMOS switching element adapted to output the second power voltage to the first node in accordance with the shift register input signal, a third PMOS switching element adapted to output the first power voltage in accordance with the clock signal, a third NMOS switching element adapted to output the second power voltage in accordance with the negative clock signal, a second node between a fourth PMOS switching element and a fourth NMOS switching element, the fourth PMOS switching element being adapted to transfer the first power voltage from the third PMOS switching element to the first node in accordance with a signal at the second node, and the fourth NMOS switching element being adapted to transfer the second power voltage from the third NMOS switching element to the first node in accordance with the signal at the second node, a fifth PMOS switching element adapted to supply the first power voltage to the second node in accordance with a signal at the first node, and a fifth NMOS switching element adapted to supply the second power voltage to the second node in accordance with the signal at the first node. The second node may be an output signal of the shift register.

The first light emitting control signal may be output to a red pixel, the second light emitting control signal may be output to a green pixel, and the third light emitting control signal may be output to a blue pixel.

At least one of the above and other features and advantages of embodiments may be realized by providing a driver of an organic electroluminescence display, the driver including a first signal processor adapted to receive a clock signal, a negative clock signal, a first input signal, a separation signal, and a negative separation signal, and a second signal processor adapted to receive the clock signal, the negative clock signal and a second input signal.

The separation signal and negative separation signal may be adapted to separate the shifted signal of the first signal processor into the first and third light emitting control signals.

The first light emitting control signal may be output to a red pixel, the second light emitting control signal may be output to a green pixel, and the third light emitting control signal may be output to a blue pixel.

The first signal processor may include a first shift register adapted to receive the clock signal, the negative clock signal and the first input signal to output an output signal, a first NAND gate adapted to receive the output signal from the first shift register and the separation signal to output the first light emitting control signal, and a second NAND gate adapted to receive the output signal from the first shift register and the negative separation signal to output the third light emitting control signal. The shifted signal of the first shift register may be an input signal of a first shift register of a next row.

The second signal processor may include a second shift register adapted to receive the clock signal, the negative clock signal and the second input signal to output an output signal, and a first inverter adapted to receive the output signal of the second shift register to output the second light emitting control signal. The shifted signal of the second shift register may be an input signal of a second shift register of a next row.

The driver may include a clock inverter adapted to receive the clock signal and to generate the negative clock signal. The driver may include a separation inverter adapted to receive the separation signal and to generate the negative separation signal.

Each of the first and second signal processors may include a first PMOS switching element adapted to output a first power voltage in accordance with the negative clock signal, a second PMOS switching element adapted to output the first power voltage to a first node in accordance with the first or second input signal, a first NMOS switching element adapted to output a second power voltage in accordance with the clock signal, a second NMOS switching element adapted to output the second power voltage to the first node in accordance with the first or second input signal, a third PMOS switching element adapted to output the first power voltage in accordance with the clock signal, a third NMOS switching element adapted to output the second power voltage in accordance with the negative clock signal, a second node between a fourth PMOS switching element and a fourth NMOS switching element, the fourth PMOS switching element being adapted to transfer the first power voltage from the third PMOS switching element to the first node in accordance with a signal at the second node, and the fourth NMOS switching element being adapted to transfer the second power voltage from the third NMOS switching element to the first node in accordance with the signal at the second node, a fifth PMOS switching element adapted to supply the first power voltage to the second node in accordance with a signal at the first node, and a fifth NMOS switching element adapted to supply the second power voltage to the second node in accordance with the signal at the first node.

The second node may be an output signal of the shift register.

At least one of the above and other features and advantages of embodiments may be realized by providing an organic electroluminescent display including the driver according to embodiments.

At least one of the above and other features and advantages of embodiments may be realized by providing a method of driving a display, including generating a clock signal and a negative clock signal, generating a first input signal, shifting the first input signal, generating a separation signal and a negative separation signal to separate the shifted first input signal into first and third light emitting control signals, generating the first light emitting control signal from the clock signal, the negative clock signal, the shifted first input signal, and the separation signal, generating the third light emitting control signal from the clock signal, the negative clock signal, the shifted first input signal, and the negative separation signal, shifting a second input signal, and generating a second light emitting control signal from the clock signal, the negative clock signal, and the shifted second input signal.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
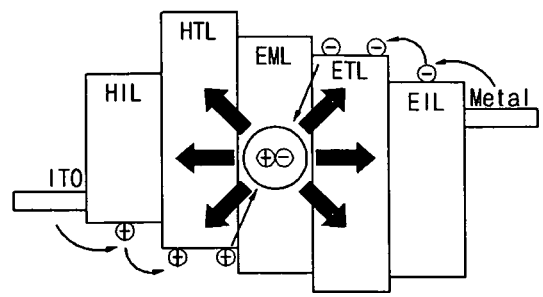
FIG. 1 illustrates a diagram of a general organic electroluminescent element.
Figure 2:
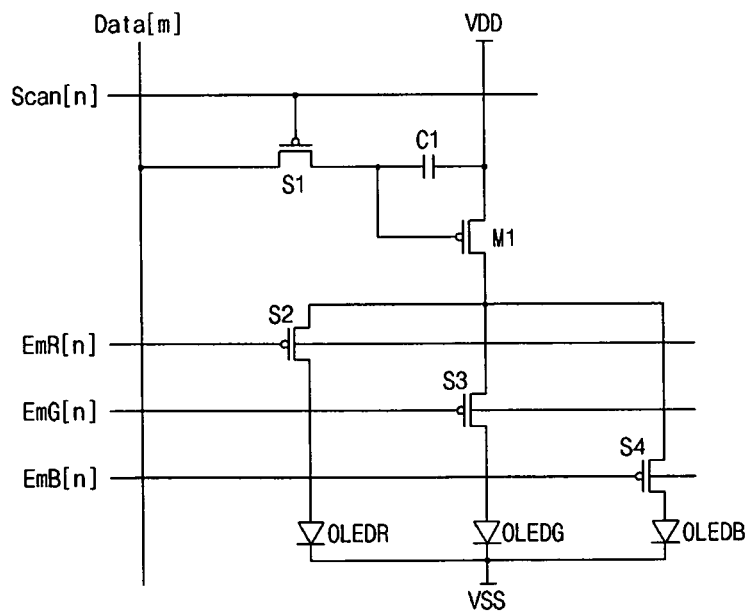
FIG. 2 illustrates a circuit diagram of a pixel circuit of a general organic electroluminescent display.

Korean Patent Application No. 10-2007-0000617, filed on Jan. 3, 2007, in the Korean Intellectual Property Office, and entitled: "Organic Electroluminescence Display and Driver Thereof," is incorporated by reference herein in its entirety.

Aspects of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 3:
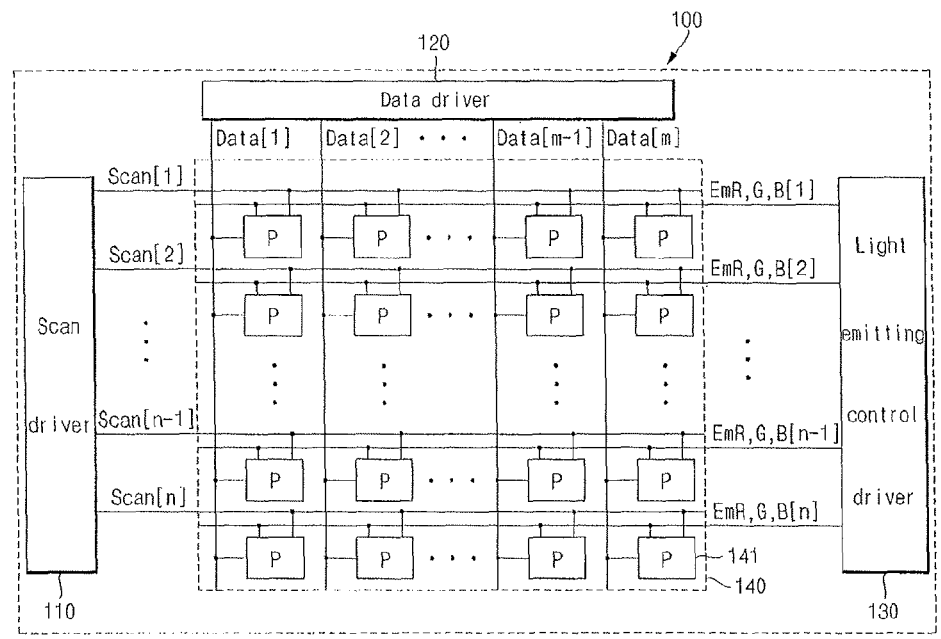
FIG. 3 illustrates a structural schematic diagram of an organic electroluminescent display according to an exemplary embodiment.

FIG. 3 illustrates a structural schematic diagram of an organic electroluminescent display 100 including a light emitting control driver 130 according to an exemplary embodiment.

Referring to FIG. 3, the organic electroluminescent display 100 may include a scan driver 110, a data driver 120, the light emitting control driver 130, and an organic electroluminescent display panel 140 (hereafter, referred to as "panel 140").

The scan driver 110 may sequentially supply a scan signal to the panel 140 through multiple scan lines Scan[1], Scan[2] . . . Scan[n].

The data driver 120 may supply a data signal to the panel 140 through multiple data lines Data[1], Data[2] . . . Data[m].

The light emitting control driver 130 may sequentially supply a light emitting control signal to the panel 140 through multiple light emitting control lines EmR, G, B[1], EmR, G, B[2] . . . EmR, G, B[n]. The light emitting control driver 130 may control a pulse width of the light emitting control signal and control the number of pulses of the light emitting control signal generated during one interval. A pixel circuit 141 connected to one of the light emitting control lines EmR, G, B[1], EmR, G, B[2] . . . EmR, G, B[n] may receive the light emitting control signal and may determine a time at which current generated from the pixel circuit 141 flows into a light emitting element. The light emitting control driver 130 may sequentially supply a red R output signal, a green G output signal and a blue B output signal to a R pixel circuit, a G pixel circuit and a B pixel circuit, respectively.

The panel 140 may include the multiple scan lines Scan[1], Scan[2] . . . Scan[n] and the multiple light emitting control lines EmR, G, B[1], EmR, G, B[2] . . . EmR, G, B[n] that may be arranged in a row direction, the multiple data lines Data[1], Data[2] . . . Data[m] that may be arranged in a column direction, and the pixel circuits 141 defined by respective ones of the multiple scan lines Scan[1], Scan[2] . . . Scan[n], the multiple data lines Data[1], Data[2] . . . Data[m], and the multiple light emitting control lines EmR, G, B[1], EmR, G, B[2] . . . EmR, G, B[n].

Each pixel circuit 141 may be in a pixel region P defined by adjacent two scan lines (or light emitting control lines) and adjacent two data lines. The scan signal may be supplied from the scan driver 110 to the multiple scan lines Scan[1], Scan[2] . . . Scan[n], a data signal may be supplied from the data driver 120 to the multiple data lines Data[1], Data[2] . . . Data[m], and the light emitting control signal may be supplied from the light emitting control driver 130 to the multiple light emitting control lines EmR, G, B[1], EmR, G, B[2] . . . EmR, G, B[n].

Figure 4:
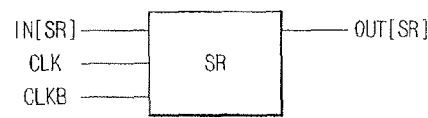
FIG. 4 illustrates a block diagram of shift register for use in a light emitting control according to an exemplary embodiment.

FIG. 4 illustrates a block diagram of a shift register SR of a light emitting control driver 130 of the organic electroluminescent display 100 in accordance with an embodiment.

Referring to FIG. 4, the shift register SR may receive an input signal IN[SR], a clock signal CLK, and a negative clock signal CLKB, and may output an output signal OUT[SR], which may be shifted relative to the input signal IN[SR].

Figure 5:
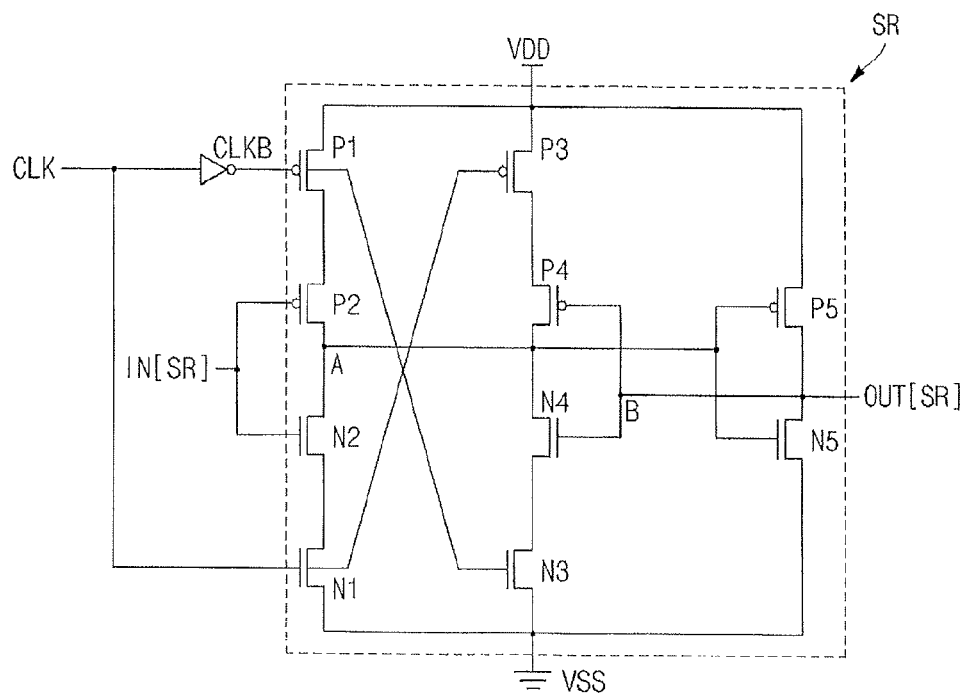
FIG. 5 illustrates a circuit diagram of an embodiment of the shift register shown in FIG. 4.

FIG. 5 illustrates a circuit diagram of the shift register SR of FIG. 4.

Referring to FIG. 5, the shift register SR may include a clock signal CLK input port, a negative clock signal CLKB port, an input signal IN[SR] port, a first power voltage VDD input port, a second power voltage VSS input port, a first PMOS switching element P1, a second PMOS switching element P2, a third PMOS switching element P3, a fourth PMOS switching element P4, a fifth PMOS switching element P5, a first NMOS switching element N1, a second NMOS switching element N2, a third NMOS switching element N3, a fourth NMOS switching element N4 and a fifth NMOS switching element N5. The clock signal CLK may be opposite to, i.e., inverted from, the negative clock signal CLKB. When the clock signal CLK is high, the negative clock signal CLKB is low, and vice versa.

A first power voltage VDD may be supplied to the shift register SR via the first power voltage VDD input port. A second power voltage VSS may be supplied to the shift register SR via the second power voltage VSS input port. The first power voltage VDD may be greater than the second power voltage VSS.

The first PMOS switching element P1 may include a first electrode (i.e., drain electrode or source electrode) that may be electrically connected to the first power voltage VDD, a second electrode (i.e., source electrode or drain electrode) that may be electrically connected to the second PMOS switching element P2, and a control electrode (i.e., gate electrode) to which the negative clock signal CLKB may be applied. The first PMOS switching element P1 may be turned on when the negative clock signal CLKB is low, such that the first power voltage VDD is supplied to the first electrode of the second PMOS switching element P2.

The second PMOS switching element P2 may include a first electrode electrically connected to the second electrode of the first PMOS switching element P1, a second electrode electrically connected to a first electrode (i.e., first node A) of the second NMOS switching element N2, and a control (gate) electrode to which the input signal IN[SR] may be applied. The second PMOS switching element P2 may be turned on when the input signal IN[SR] is low, such that the first power voltage VDD is supplied to the first node A.

The third PMOS switching element P3 may include a first electrode electrically connected to the first power voltage VDD, a second electrode electrically connected to the fourth PMOS switching element P4, and a control (gate) electrode to which the clock signal CLK may be applied. The third PMOS switching element P3 may be turned on when the clock signal CLK is low, such that the first power voltage VDD is supplied to the first electrode of the fourth PMOS switching element P4.

The fourth PMOS switching element P4 may include a first electrode electrically connected to the second electrode of the third PMOS switching element P3, a second electrode electrically connected to the first electrode (i.e., first node A) of the third NMOS switching element N3, and a control (gate) electrode to which the output signal OUT[SR] is applied. The fourth PMOS switching element P4 may be turned on when the output signal OUT[SR] is low, such that the first power voltage VDD is supplied to the first node A.

The fifth PMOS switching element P5 may include a first electrode electrically connected to the first power voltage VDD, a second electrode electrically connected to a first electrode of the fifth NMOS switching element N5, and a control electrode (gate) electrically connected to the first node A. The fifth PMOS switching element P5 may be turned on when the control electrode receives a low signal from the first node A, such that the first power voltage VDD is output as the output signal OUT[SR].

The first NMOS switching element N1 may include a first electrode electrically connected the second NMOS switching element N2, a second electrode electrically connected to the second power voltage VSS, and a control electrode (gate) to which the clock signal CLK may be applied. The first NMOS switching element N1 may be turned on when the clock signal CLK is high, such that the second power voltage VSS may be supplied to the second NMOS switching element N2.

The second NMOS switching element N2 may include a first electrode electrically connected the second electrode (i.e., first node A) of the second PMOS switching element P2, a second electrode electrically connected to the first electrode of the first NMOS switching element N1, and a control electrode (gate) to which the input signal IN[SR] is applied. The second NMOS switching element N2 may be turned on when the input signal IN[SR] is high, such that the second power voltage VSS may be supplied to the first node A.

The third NMOS switching element N3 may include a first electrode electrically connected to the fourth NMOS switching element N4, a second electrode electrically connected to the second power voltage VSS, and a control electrode (gate) to which the negative clock signal CLKB is applied. The third NMOS switching element N3 may be turned on when the negative clock signal CLKB is high, such that the second power voltage VSS is supplied to the second electrode of the fourth NMOS switching element N4.

The fourth NMOS switching element N4 may include a first electrode electrically connected to the second electrode of the fourth PMOS switching element P4, a second electrode electrically connected to the first electrode of the third NMOS switching element N3, and a control electrode (gate) to which the output signal OUT[SR] is applied. The fourth NMOS switching element N4 may be turned on when the output signal OUT[SR] is high, such that the second power voltage VSS is supplied to the first node A.

The fifth NMOS switching element N5 may include a first electrode electrically connected to the second electrode of the fifth PMOS switching element P5, a second electrode electrically connected to the second power voltage VSS, and a control electrode (gate) electrically connected to the first node A. The fifth NMOS switching element N5 may be turned on when a signal at node A is high, such that the second power voltage VSS is output as the output signal OUT[SR].

Figure 6:
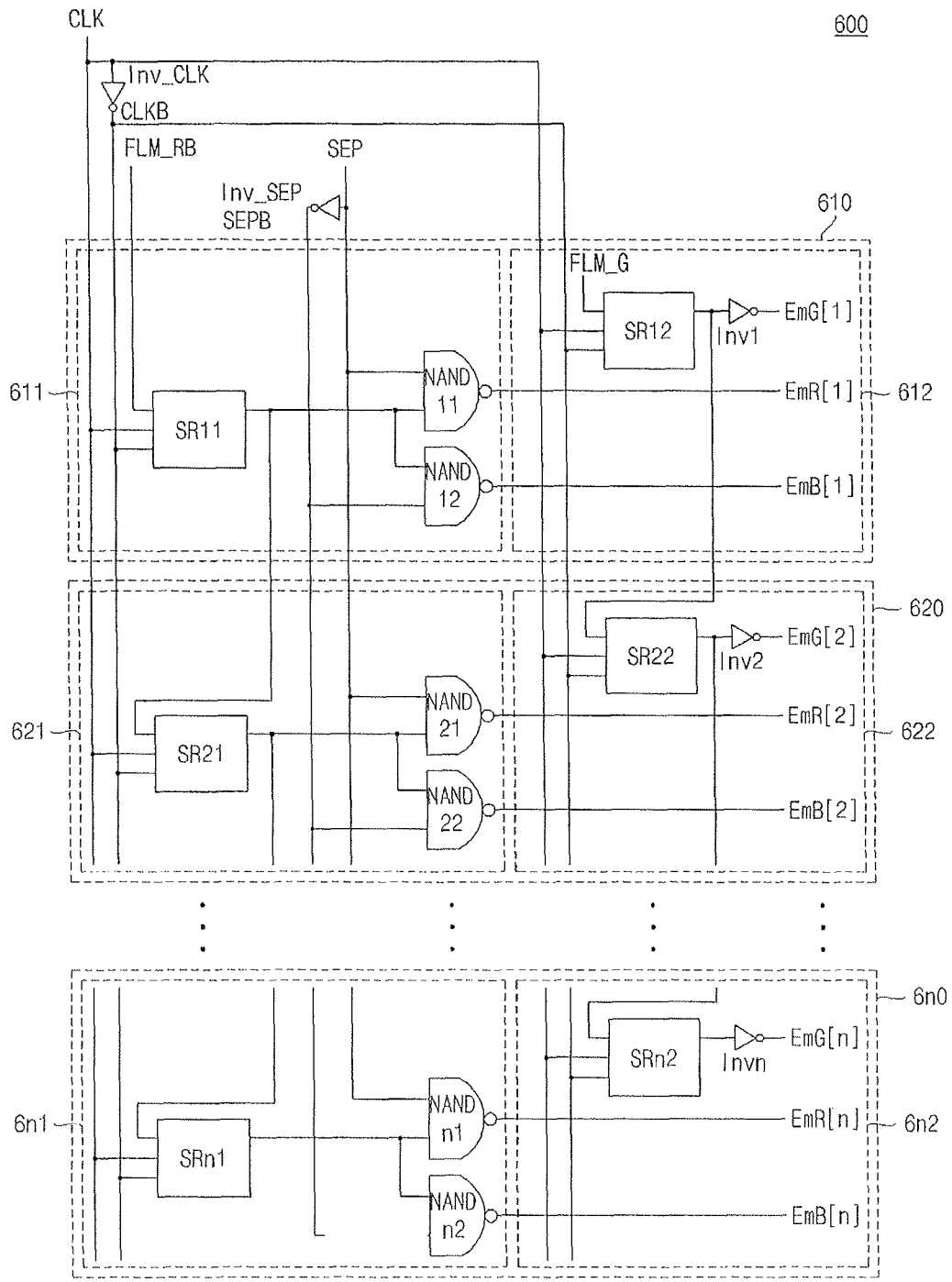
FIG. 6 illustrates a circuit diagram of the light emitting control driver of the organic electroluminescent display according to an exemplary embodiment.

FIG. 6 illustrates a block diagram of a light emitting control driver 600 of an organic electroluminescent display according to an exemplary embodiment. The light emitting control driver 600 may be used as the light emitting control driver 130 of FIG. 3.

Referring to FIG. 6, the light emitting control driver 600 may include a clock inverter Inv_CLK, a separation inverter Inv_SEP, and 1 to n drivers 610, 620 . . . 6n0. The light emitting control driver 600 may receive a first input signal FLM_RB, a second input signal FLM_G, the clock signal CLK, the negative clock signal CLKB, a separation signal SEP, and a negative separation signal SEPB, and may output red light emitting control signals EmR[1], EmR[2] . . . EmR[n], green light emitting control signals EmG[1], EmG[2] . . . EmG[n], and blue light emitting control signals EmB[1], EmB[2] . . . EmB[n].

The clock inverter Inv_CLK may receive the clock signal CLK and may generate the negative clock signal CLKB. When the clock signal CLK is high, the negative clock signal CLKB is low, and vice versa. The separation inverter Inv_SEP may receive the separation signal SEP and may generate the negative separation signal SEPB. When the separation signal SEP is high, the negative separation signal SEPB is low, and vice versa. The separation signal SEP and negative separation signal SEPB may be signals for separating the light emitting control signal into the red light emitting control signals EmR[1], EmR[2] . . . EmR[n] and the blue light emitting control signals EmB[1], EmB[2] . . . EmB[n].

The first driver 610 may include a first signal processor 611 and a second signal processor 612. The first signal processor 611 may include a first shift register SR11, a first NAND gate NAND11, and a second NAND gate NAND12. The first signal processor 611 may receive the first input signal FLM_RB, the clock signal CLK, the negative clock signal CLKB, the separation signal SEP and the negative separation signal SEPB, and may output a first red light emitting control signal EmR[1] and a first blue light emitting control signal EmB[1]. The first red light emitting control signal EmR[1] and the first blue light emitting control signal EmB[1] may be output by employing a single, common shift register SR11. Thus, compared to a conventional driver, one shift register, e.g., including five NMOS transistors and five PMOS transistors, may then be eliminated, which thereby may allow circuit area to be reduced, error rate to be reduced, and yield to be improved.

The first shift register SR11 may receive the first input signal FLM_RB, the clock signal CLK and the negative clock signal CLKB, and may generate an output signal. The output signal of the first shift register SR11 may be an input signal of a first shift register SR21 in the second driver 620.

The first NAND gate NAND11 may receive the output signal of the first shift register SR11 and the separation signal SEP, and may output the first red light emitting control signal EmR[1].

The second NAND gate NAND12 may receive the output signal of the first shift register SR11 and the negative separation signal SEPB, and may output the first blue light emitting control signal EmB[1].

The second signal processor 612 may include the second shift register SR12 and an inverter Inv1. The second signal processor 612 may receive the second input signal FLM_G, the clock signal CLK and the negative clock signal CLKB, and may output, through the inverter Inv1, the first green light emitting control signal EmG[1].

The second shift register SR12 may also receive the second input signal FLM_G, the clock signal CLK, and the negative clock signal CLKB, and may generate an output signal of the second shift register SR12. The output signal of the second shift register SR12 may be an input signal of the second shift register SR22 in the second driver 620.

The second to n-th drivers 620 . . . 6n0 may have the same structure as the first driver 610. The first red light emitting control signal EmR[1] may be a light emitting control signal that is transferred to a red pixel, the first blue light emitting control signal EmB[1] may be a light emitting control signal that is transferred to a blue pixel, and the first green light emitting control signal EmG[1] may be a light emitting control signal that is transferred to a green pixel.

The second driver 620 may include signal processors 621 and 622 similar to first and second signal processors 611 and 612, respectively. The n-th driver 6n0 may include signal processors 6n1 and 6n2 similar to first and second signal processors 611 and 612, respectively. Signal processors 621 to 6n1 may include shift registers SR21 to SRn1, NAND gates NAND 21 to NANDn1, and NAND gates NAND 22 to NANDn2, which may function similarly to the shift register SR11 and NAND agates NAND11 and NAND12. Signal processors 622 to 6n2 may include shift registers SR22 to SRn2 and inverters Inv2 to Invn, which may function similarly to the shift register SR12 and the inverter Inv1.

Figure 7:
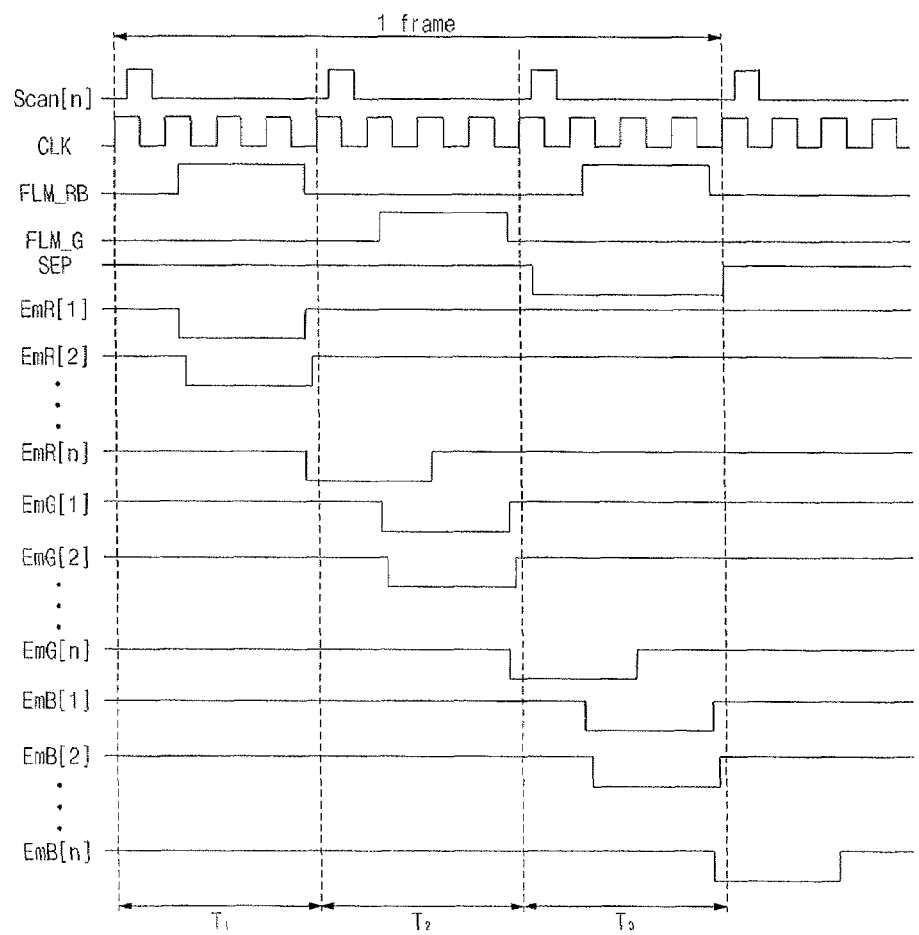
FIG. 7 illustrates a timing chart of the light emitting control driver of the organic electroluminescent display according to an exemplary embodiment.

FIG. 7 illustrates a timing chart of an operation of the light emitting control driver 600 of FIG. 6.

Referring to FIG. 7, a first frame may be divided into first to third sub-frames $T_1$, $T_2$ and $T_3$, each of which may be separated depending on a cycle where scan signals Scan[1], Scan[2] . . . Scan[n] may be input.

In the first sub-frame $T_1$, the first input signal FLM_RB is high, the second input signal FLM_G is low, the separation signal SEP is high, the negative separation signal SEPB (not shown) is low, the clock signal CLK and the negative clock signal CLKB (not shown) are input, the red light emitting control signals EmR[1], EmR[2] . . . EmR[n] are low, the green light emitting control signals EmG[1], EmG[2] . . . EmG[n] are high, and the blue light emitting control signals EmB[1], EmB[2] . . . EmB[n] are high.

When the first input signal FLM_RB is high, the output signal of the first shift register SR11 may be shifted and high. When the output signal of the first shift register SR11 is high and the separation signal SEP is high, the first NAND gate NAND11 may output the red light emitting control signal EmR[1]. The output signal of the first shift register SR11 may be the input signal of the first shift register SR21 in the second driver 620, which may output a low second red light emitting control signal EmR[2]. Low red light emitting control signals EmR[3] . . . EmR[n] may be sequentially output from respective remaining drivers.

When the second input signal FLM_G is low, the output signal of the second shift register SR12 may be shifted and low. When the output signal of the second shift register SR12 is low, the first inverter Inv1 may output a high first green light emitting control signal EmG[1]. The output signal of the second shift register SR12 may be the input signal from the second shift register SR22 of the second driver 620, which may output a high second green light emitting control signal EmG[2]. High green light emitting control signals EmG[3] . . . EmG[n] may be sequentially output from respective remaining drivers.

When the first input signal FLM_RB is high, the output signal of the first shift register SR11 may be shifted and high. When the output signal of the first shift register SR11 is high and the separation signal SEPB is low, the second NAND gate NAND 12 may output a high first blue light emitting control signal EmB[1]. The first output signal of the first shift register SR11 may be the input signal of the first shift register SR21 of the second driver 620, which may output a high second blue light emitting signal EmB[2]. High blue light emitting control signals EmB[3] . . . EmB[n] may be sequentially output from respective remaining drivers.

In the second sub-frame $T_2$, the first input signal FLM_RB is low, the second input signal FLM_G is high, the separation signal SEP is high, the negative separation signal SEPB is low, the clock signal CLK and the negative clock signal CLKB are input, the red light emitting control signals EmR[1], EmR[2] . . . EmR[n] are high, the green light emitting control signals EmG[1], EmG[2] . . . EmG[n] are low, and the blue light emitting control signals EmB[1], EmB[2] . . . EmB[n] are high.

When the first input signal FLM_RB is low, the output signal of the first shift register SR11 may be shifted and low. When the output signal of the first shift register SR11 is low and the separation signal SEP is high, the first NAND gate NAND11 may output a high red light emitting control signal EmR[1]. The output signal of the first shift register SR11 may be the input signal of the first shift register SR21 in the second driver 620, which may output a high second red light emitting control signal EmR[2]. High red light emitting control signals EmR[3] . . . EmR[n] may be sequentially output from respective remaining drivers.

When the second input signal FLM_G is high, the output signal of the second shift register SR12 may be shifted and high. When the output signal of the second shift register SR12 is high, the first inverter Inv1 may output a low first green light emitting control signal EmG[1]. The output signal of the second shift register SR12 may be the input signal from the second shift register SR22 of the second driver 620, which may output a low second green light emitting control signal EmG[2]. Low green light emitting control signals EmG[3] . . . EmG[n] may be sequentially output from respective remaining drivers.

When the first input signal FLM_RB is low, the output signal of the first shift register SR11 may be shifted and low. When the output signal of the first shift register SR11 is low and the separation signal SEPB is low, the second NAND gate NAND 12 may output a high first blue light emitting control signal EmB[1]. The first output signal of the first shift register SR11 may be the input signal of the first shift register SR21 of the second driver 620, which may output a high second blue light emitting signal EmB[2]. High blue light emitting control signals EmB[3] . . . EmB[n] may be sequentially output from respective remaining drivers.

In the third sub-frame T3, the first input signal FLM_RB is high, the second input signal FLM_G is low, the separation signal SEP is low, the negative separation signal SEPB is high, the clock signal CLK and the negative clock signal CLKB are input, and the red light emitting control signals EmR[1], EmR[2] . . . mR[n] are high, the green light emitting control signals EmG[1], EmG[2] . . . mG[n] are high, and the blue light emitting control signals EmB[1], EmB[2] . . . EmB[n] are low.

When the first input signal FLM_RB is high, the output signal of the first shift register SR11 may be shifted and high. When the output signal of the first shift register SR11 high and the separation signal SEP is low, the first NAND gate NAND11 may output a high red light emitting control signal EmR[1]. The output signal of the first shift register SR11 may be the input signal of the first shift register SR11 in the second driver 620, which may output a high second red light emitting control signal EmR[2]. High red light emitting control signals EmR[3] . . . EmR[n] may be sequentially output from respective remaining drivers.

When the second input signal FLM_G is low, the output signal of the second shift register SR12 may be shifted and low. When the output signal of the second shift register SR12 is low, the first inverter Inv1 may output a high first green light emitting control signal EmG[1]. The output signal of the second shift register SR12 may be the input signal from the second shift register SR12 of the second driver 620, which may output a high second green light emitting control signal EmG[2]. High green light emitting control signals EmG[3] . . . EmG[n] may be sequentially output from respective remaining drivers.

When the first input signal FLM_RB is high, the output signal of the first shift register SR11 may be shifted and high. When the output signal of the first shift register SR11 is high and the separation signal SEPB is high, the second NAND gate NAND 12 may output a low first blue light emitting control signal EmB[1]. The first output signal of the first shift register SR11 may be the input signal of the first shift register SR21 of the second driver 620, which may output a low second blue light emitting signal EmB[2]. Low blue light emitting control signals EmB[3] . . . EmB[n] may be sequentially output from respective, remaining drivers.

As described above, the organic electroluminescent display and the driver thereof according to the present invention may produce the following effect.

Three light emitting control signals, i.e., the red (R) light emitting control signal, the green (G) light emitting control signal and the blue (B) light emitting control signal may be produced, from two shift registers, thereby allowing the number of transistors of the light emitting control driver and the circuit area to be reduced and the yield to be improved by decreasing the error rate caused by the transistors. In other words, one shift register may be replaced by two logic gates.

Examples of Thin Film Transistors

Crystallization of a thin film transistor of the light emitting control driver 130 may include excimer laser crystallization (ELA) employing an excimer laser, metal induced crystallization (MIC) employing a promoting material, and solid phase crystallization (SPC). The crystallization of the thin film transistor of the light emitting control driver 130 may include high pressure annealing (HPA) for promoting the crystallization at high temperature and humid atmosphere, and sequential lateral solidification (SLS) employing a mask in the ELA method.

Among the methods for crystallizing a thin film transistor into polysilicon, the ELA method may be mainly used. The ELA method may employ crystallization of a polysilicon-based liquid crystal.

The MIC method may be one of the methods capable of crystallizing at low temperatures without employing the ELA method. The MIC method may deposit or spin-coat a metal catalyst metal, e.g., Ni, Co, Pd, Ti, etc., so as to allow the metal catalyst metal to directly penetrate into a surface of amorphous silicon (a-Si) and crystallize while a phase of the a-Si changes.

The MIC method may maximally restrain a contaminant, e.g., nickel silicide, on a specific region of the thin film transistor by employing a mask, when a metal layer is formed on the surface of the amorphous silicon. This MIC method is referred to as a metal induced lateral crystallization (MILC). The MIC method may use a shadow mask as the mask. The shadow mask may be a line-type mask or a dot type mask.

The MIC method may deposit a capping layer, when a metal catalyst layer is deposited or spin-coated on the surface of the amorphous silicon, so that a catalytic amount of the metal induced to the amorphous silicon may be controlled. This MIC method is referred to as a metal induced crystallization with a capping layer (MICC). The capping layer may employ a silicon nitride film. The catalytic amount of the metal induced from the metal catalyst layer to the amorphous silicon may become different according to a thickness of a silicon nitride film. The metal catalyst being induced into the silicon nitride film may be wholly formed on the silicon nitride film, and may be selectively formed employing the shadow mask.

The a-Si may be crystallized into the polysilicon by the metal catalyst layer, and then the capping layer may be selectively removed. The capping layer may be removed by employing at least one of a wet etching or a dry etching process. After the polysilicon is formed, a gate insulation film may be formed, and then a gate electrode may be formed on the gate insulation film. An interlayer insulation film may be formed on the gate electrode. After forming a via hole in the interlayer insulation film, impurities may be injected into the polysilicon crystallized through the via hole so as to allow the metal catalytic impurities in the inside of the polysilicon to be removed. This is referred to as a "gettering process." The gettering process may include a process of injecting impurities and a heating process of heating the thin film transistor at a low temperature. The gettering process may impart good quality to the thin film transistor.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A driver of an organic electroluminescence display generating first to third light emitting control signals, the driver comprising:

a first signal processor adapted to output first and third light emitting control signals, the first signal processor includes a first shift register adapted to receive a clock signal, a negative clock signal, and a first input signal, and to output a shifted signal, and a first logic gate adapted to receive the shifted signal from the first shift register and a separation signal, and to output the first light emitting control signal; and a second signal processor adapted to output a second light emitting control signal, the second signal processor includes a second shift register adapted to receive the clock signal, the negative clock signal and a second input signal, and to output a shifted signal, wherein the first light emitting control signal is output to only a first one of a red pixel, a green pixel, and a blue pixel, the second light emitting control signal is output to only a second one of the red pixel, the green pixel, and the blue pixel, and the third light emitting control signal is output to only a third one of the red pixel, the green pixel, and the blue pixel, and wherein the first signal processor outputs the first and third light emitting control signals independently from the second light emitting control signal output from the second signal processor.

2. The driver as claimed in claim 1, wherein the first signal processor further includes:
a second logic gate adapted to receive the shifted signal from the first shift register and a negative separation signal, and to output the third light emitting control signal.

3. The driver as claimed in claim 2, wherein the separation signal and negative separation signal are adapted to separate the shifted signal of the first shift register into the first and third light emitting control signals.

4. The driver as claimed in claim 2, further including a clock inverter adapted to receive the clock signal and to generate the negative clock signal.

5. The driver as claimed in claim 2, further including a separation inverter adapted to receive the separation signal and to generate the negative separation signal.

6. The driver as claimed in claim 2, wherein the shifted signal of the first shift register is an input signal of a first shift register of a next row.

7. The driver as claimed in claim 2, wherein the logic gates are NAND gates.

8. The driver as claimed in claim 2, wherein the second signal processor further includes:
a first inverter adapted to receive the shifted signal of the second shift register and to output a second light emitting control signal.

9. The driver as claimed in claim 8, wherein the shifted signal of the second shift register is an input signal of a second shift register of a next row.

10. The driver as claimed in claim 8, wherein each of the first and second shift registers includes:
a first PMOS switching element adapted to output a first power voltage in accordance with the negative clock signal;
a second PMOS switching element adapted to output the first power voltage to a first node in accordance with a shift register input signal;
a first NMOS switching element adapted to output a second power voltage in accordance with the clock signal;
a second NMOS switching element adapted to output the second power voltage to the first node in accordance with the shift register input signal;
a third PMOS switching element adapted to output the first power voltage in accordance with the clock signal;
a third NMOS switching element adapted to output the second power voltage in accordance with the negative clock signal;
a second node between a fourth PMOS switching element and a fourth NMOS switching element, the fourth PMOS switching element being adapted to transfer the first power voltage from the third PMOS switching element to the first node in accordance with a signal at the second node, and the fourth NMOS switching element being adapted to transfer the second power voltage from the third NMOS switching element to the first node in accordance with the signal at the second node;
a fifth PMOS switching element adapted to supply the first power voltage to the second node in accordance with a signal at the first node; and
a fifth NMOS switching element adapted to supply the second power voltage to the second node in accordance with the signal at the first node.

11. The driver as claimed in claim 10, wherein the second node is an output signal of the shift register.

12. An organic electroluminescent display comprising the driver as claimed in claim 1.

13. A driver of an organic electroluminescence display, the driver comprising:
a first signal processor adapted to receive a clock signal, a negative clock signal, a first input signal, a separation signal, and a negative separation signal, the first signal processor includes a first shift register adapted to receive the clock signal, the negative clock signal and the first input signal to output a first output signal, and a first NAND gate adapted to receive the first output signal from the first shift register and the separation signal to output a first light emitting control signal, a third light emitting control signal based on the first output signal; and a second signal processor adapted to receive the clock signal, the negative clock signal and a second input signal, the second signal processor includes a second shift register adapted to receive the clock signal, the negative clock signal and the second input signal to output a second output signal, a second light emitting control signal based on the second output signal, wherein:

the first light emitting control signal is output to only a first one of a red pixel, a green pixel, and a blue pixel, the second light emitting control signal is output to only a second one of the red pixel, the green pixel, and the blue pixel, and the third light emitting control signal is output to only a third one of the red pixel, the green pixel, and the blue pixel, and the first signal processor outputs the first and third light emitting control signals independently from the second light emitting control signal from the second signal processor.

14. The driver as claimed in claim 13, wherein the separation signal and negative separation signal are adapted to separate the shifted signal of the first signal processor into the first and third light emitting control signals.

15. The driver as claimed in claim 13, wherein the first signal processor further includes: a second NAND gate adapted to receive the first output signal from the first shift register and the negative separation signal to output the third light emitting control signal.

16. The driver as claimed in claim 15, wherein the first output signal of the first shift register is an input signal of a first shift register of a next row.

17. The driver as claimed in claim 13, wherein the second signal processor further includes: a first inverter adapted to receive the second output signal of the second shift register to output the second light emitting control signal.

18. The driver as claimed in claim 17, wherein the second output signal of the second shift register is an input signal of a second shift register of a next row.

19. The driver as claimed in claim 13, further including a clock inverter adapted to receive the clock signal and to generate the negative clock signal.

20. The driver as claimed in claim 13, further including a separation inverter adapted to receive the separation signal and to generate the negative separation signal.

21. The driver as claimed in claim 13, wherein each of the first and second signal processors includes:
- a first PMOS switching element adapted to output a first power voltage in accordance with the negative clock signal;
- a second PMOS switching element adapted to output the first power voltage to a first node in accordance with the first or second input signal;
- a first NMOS switching element adapted to output a second power voltage in accordance with the clock signal;
- a second NMOS switching element adapted to output the second power voltage to the first node in accordance with the first or second input signal;
- a third PMOS switching element adapted to output the first power voltage in accordance with the clock signal;
- a third NMOS switching element adapted to output the second power voltage in accordance with the negative clock signal;
- a second node between a fourth PMOS switching element and a fourth NMOS switching element, the fourth PMOS switching element being adapted to transfer the first power voltage from the third PMOS switching element to the first node in accordance with a signal at the second node, and the fourth NMOS switching element being adapted to transfer the second power voltage from the third NMOS switching element to the first node in accordance with the signal at the second node;
- a fifth PMOS switching element adapted to supply the first power voltage to the second node in accordance with a signal at the first node; and
- a fifth NMOS switching element adapted to supply the second power voltage to the second node in accordance with the signal at the first node.

22. The driver as claimed in claim 21, wherein the second node is an output signal of the first shift register.

23. An organic electroluminescent display comprising the driver as claimed in claim 13.

* * * * *